(12) United States Patent
Agnello et al.

(10) Patent No.: US 6,407,436 B1
(45) Date of Patent: Jun. 18, 2002

(54) SEMICONDUCTOR DEVICE WITH ABRUPT SOURCE/DRAIN EXTENSIONS WITH CONTROLLABLE GATE ELECTRODE OVERLAP

(75) Inventors: Paul D. Agnello, Wappingers Falls; Peter I. Smeys, White Plains, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/928,965

(22) Filed: Aug. 14, 2001

Related U.S. Application Data

(62) Division of application No. 09/407,632, filed on Sep. 28, 1999, now Pat. No. 6,274,446.

(51) Int. Cl.$^7$ .............................. H01L 29/76
(52) U.S. Cl. ................ 257/412; 257/408; 438/305; 438/592
(58) Field of Search ................ 257/408, 412; 438/248, 305, 592

(56) References Cited

U.S. PATENT DOCUMENTS

| | | |
|---|---|---|
| 5,015,598 A | 5/1991 | Verhaar |
| 5,034,791 A | 7/1991 | Kameyama et al. |
| 5,091,763 A | 2/1992 | Sanchez |
| 5,120,673 A | 6/1992 | Itoh |
| 5,196,357 A | 3/1993 | Boardman et al. |
| 5,206,532 A | 4/1993 | Roberts |
| 5,227,320 A | 7/1993 | Johnson et al. |
| 5,256,585 A | 10/1993 | Bae |
| 5,358,879 A | 10/1994 | Brady et al. |
| 5,405,795 A | 4/1995 | Beyer et al. |
| 5,411,906 A | 5/1995 | Johnson et al. |
| 5,472,894 A | 12/1995 | Hsu et al. |
| 5,482,871 A | 1/1996 | Pollack |
| 5,493,130 A | 2/1996 | Dennison et al. |
| 5,543,340 A | 8/1996 | Lee |
| 5,559,049 A | 9/1996 | Cho |
| 5,621,236 A | 4/1997 | Choi et al. |
| 5,710,054 A | 1/1998 | Gardner et al. |
| 5,716,866 A | 2/1998 | Dow et al. |
| 5,753,557 A | 5/1998 | Tseng |
| 5,756,365 A | 5/1998 | Kakumu |
| 5,759,885 A | 6/1998 | Son |
| 5,759,920 A | 6/1998 | Burns, Jr. et al. |
| 5,891,771 A * | 4/1999 | Wu et al. .............. 438/248 |
| 5,989,967 A | 11/1999 | Gardner et al. |
| 6,010,954 A | 1/2000 | Ho et al. |
| 6,107,130 A | 8/2000 | Fulford, Jr. et al. |

* cited by examiner

*Primary Examiner*—Olik Chaudhuri
*Assistant Examiner*—David S Blum
(74) *Attorney, Agent, or Firm*—Connolly Bove Lodge & Hutz LLP; Joseph P. Abate

(57) ABSTRACT

A method for forming source/drain extensions with gate overlap. An oxide layer is formed on a semiconductor substrate and a gate structure on the semiconductor substrate. First, sidewall spacer regions are formed on sides of the gate structure. Second spacer regions are formed on sides of the sidewall spacer regions. Upper regions of the gate structure and the sidewall spacer regions are silicided. Portions of source and drain extension regions in the semiconductor substrate adjacent the gate structure are also silicided.

6 Claims, 3 Drawing Sheets

SEMICONDUCTOR DEVICE WITH ABRUPT SOURCE/DRAIN EXTENSIONS WITH CONTROLLABLE GATE ELECTRODE OVERLAP

This is a divisional of Ser. No. 09/407,632 filed Sep. 28, 1999 now U.S. Pat. No. 6,274,446.

FIELD OF THE INVENTION

The invention relates to CMOS devices. In particular, the present invention relates to deep submicron CMOS devices and methods for making at least a portion of such devices.

BACKGROUND OF THE INVENTION

As semiconductor device features shrink in size and feature density increases, problems arise concerning the formation of the semiconductor devices. Often, feature requirements conflict with competing concerns involved in making the device features smaller and more densely packed in a given surface area.

SUMMARY OF THE INVENTION

The present invention provides a method for forming source/drain extensions with gate overlap. The method includes forming an oxide layer on a gate structure on a semiconductor substrate. Sidewall spacer regions are formed on the sides of the gate structure. Spacer regions are formed on the sides of the sidewall spacer regions. Upper regions of the gate structure and the sidewall spacer regions are silicided along with portions of source/drain extension regions in the semiconductor substrate adjacent the gate structure.

Additionally, the present invention concerns a method of forming a semiconductor device structure. A gate oxide region is formed on a semiconductor substrate. A gate structure is formed on the gate oxide region. An oxide layer is formed on the semiconductor substrate and gate structure. Source and drain extension regions are implanted in the semiconductor substrate. First, sidewall spacer regions are formed on sides of the gate structure. Deep source/drain regions are implanted in the semiconductor substrate. Second spacer regions are formed on sides of the sidewall spacer regions. The oxide layer on the gate structure and on the sides of the gate structure in the vicinity of the top of the gate structure is removed. The gate structure and the sidewall spacer regions are silicided in the vicinity of the top of the gate structure and the sidewall spacer regions. Portions of the source/drain extension regions not covered by the sidewall spacer regions or the spacer regions are also silicided.

The present invention also includes a semiconductor device structure. The semiconductor device structure includes a semiconductor substrate and a gate oxide region on portions of the semiconductor substrate. A gate structure is arranged on the gate oxide region. A portion of the gate structure in the vicinity of a top of the gate oxide region is silicided. First, sidewall spacer regions are arranged on sides of the gate structure. A portion of the sidewall spacer region in the vicinity of the top of the sidewall spacer regions is silicided. Second spacer regions are arranged on the sides of the sidewall spacer regions. An oxide layer is arranged between the semiconductor substrate and the sidewall spacer regions and the second spacer regions. Source/drain extension regions in the substrate underlie the sidewall spacer regions and the second spacer regions. Silicided source/drain extension regions are arranged in the substrate adjacent the source/drain extension regions in the substrate underlying the sidewall spacer regions and the second spacer regions. Source/drain regions underlie the source/drain extension regions and the silicided source/drain extension regions.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1A:
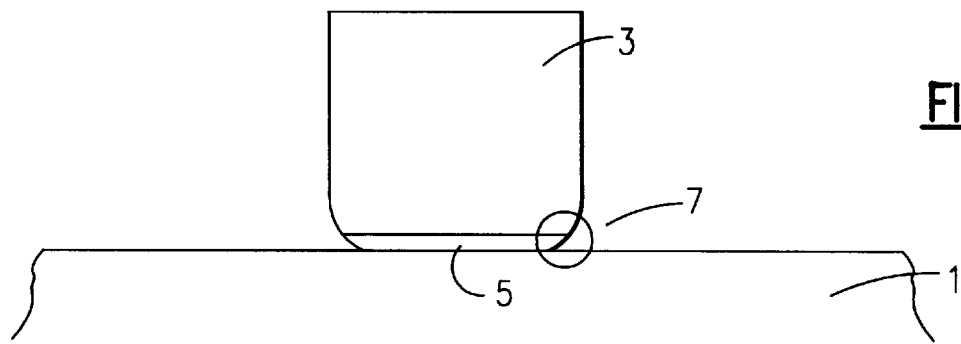
FIGS. 1a–1h represent cross-sectional views of an embodiment of a structure according to the present invention at various stages of an embodiment of a process according to the present invention.

In deep submicron devices, abrupt source/drain extension profiles may be required to control short channel effects. Additionally, a polycrystalline silicon gate structure in the devices may be required to overlap the extensions sufficiently in order to reduce an initial drain current degradation, or prompt shift. The overlap may also be necessary to reduce device asymmetry caused by hot carrier effects.

According to standard CMOS processes, sufficient gate overlap typically is obtained by laterally diffusing a junction under the gate electrode. However, consequences of the lateral diffusion may include graded doping profile and degraded short channel effect. From a process window point of view, an additional limit on the minimum lateral diffusion may result from the fact that a realistic polycrystalline silicon gate profile often exhibits a slight overhang. In advanced CMOS devices, this overhang can result in "underlapped" source/drain extensions. The competing requirements of abrupt junctions, sufficient gate overlap, and polysilicon gate profile may limit the scalability of conventional CMOS transistor architecture.

The present invention provides a solution to the above as well as other problems. Along these lines, the present invention provides a method for fabricating a CMOS transistor with controlled gate overlap while maintaining a very abrupt source/drain extension profile. The advantages of the present invention include minimizing diffusion of the junction so as to maintain a very abrupt junction. The abrupt junction also reduces the short channel effect, leading to a more scalable device, particularly at a constant $L_{\it{eff}}$.

Also, a polysilicon sidewall spacer that may be included in a structure according to the present invention can provide necessary gate control over the source/drain extensions to reduce prompt shift, or high electron degradation, due to a reduced lateral electric field. Along these lines, a lateral electric field may be reduced by the enhanced gate coupling by reducing hot electron degradation. A further advantage of the present invention is that it is compatible with standard CMOS processing. Along these lines, the present invention represents a low added process complexity. For example, embodiments of the present invention may include one additional LPCVD deposition and one additional RIE etch.

Known solutions to the above problems typically involve complex schemes to produce fully overlapped devices. Unlike the present invention, such solutions typically involve significant deviations from standard CMOS processing. For example, the proposed gate overlapped LDD (GOLD) device structure represents one such significant deviation from standard CMOS processing. The GOLD structure is described by Izawa et al., *Impact of the gate-drain overlapped device (GOLD) for deep submicron VLSI*, IEEE TRANSACTIONS ON ELECTRON DEVICES, 35 (1988), the entire contents of which are hereby incorporated by reference.

Additionally, proposed solutions typically are difficult to control and generally require implantation of the source/drain extensions through a thick polysilicon layer. Such a process can introduce a significant increase in doping profile straggle, thereby limiting the ability to form abrupt shallow junctions. Furthermore, as compared to known processes for dealing with the above described problems, the present invention provides more controlled overlap capacitance, leading to improved manufacturability.

By providing a process that is easily incorporated into standard CMOS processing, the present invention provides a method for forming source/drain extensions with gate overlap. An oxide layer is formed on a semiconductor substrate. A gate structure is also formed on the semiconductor substrate. First, sidewall spacer regions are formed on sides of the gate structure. Second spacer regions are formed on sides of the sidewall spacer regions. The upper regions of the gate structure and the sidewall spacer regions are silicided. Additionally, portions of the source/drain extensions in a semiconductor substrate adjacent the gate structure are silicided.

Another embodiment of the present invention includes a method for forming a semiconductor device structure. The method includes forming a gate oxide region on a semiconductor substrate. A gate structure is formed on the gate oxide region. An oxide layer is formed on the semiconductor substrate and a gate structure. Source/extension regions are implanted into the semiconductor substrate. First, sidewall spacer regions are formed on the sides of the gate structure. Second spacer regions are formed on sides of the sidewall spacer regions. Deep source/drain regions are implanted in the semiconductor substrate. Then, the oxide layer on the gate structure and on the sides of the gate structure in the vicinity of the top of the gate structure are removed. Then, the gate structure and the sidewall spacer regions are silicided in the vicinity of the top of the gate structure and the sidewall spacer regions. Also, portions of the source/drain extension regions not covered by the sidewall spacer regions or the second spacer regions are silicided.

As referred to above, the steps described above for forming the gate oxide and gate structure may be carried out utilizing standard CMOS processing. However, after forming of the gate structure on the gate oxide region, the present invention may deviate from standard CMOS processing by forming an oxide layer on the semiconductor substrate and gate structure. The oxide layer may have a thickness of about 3 nanometers to about 10 nanometers. In further deviation from standard CMOS processing, extension anneals, which are typically part of CMOS processing, may be deleted from the processing sequence.

FIG. 1a represents a cross-sectional view of a structure after polysilicon gate formation. The structure illustrated in FIG. 1a includes substrate 1 on which gate 3 has been formed. A gate oxide 5 lies between the gate 3 and the substrate 1. FIG. 1a illustrates the problem of undercut 7 described above with respect to processes utilized in standard CMOS processing. The undercut can lead to a physical underlap of the extension and can cause high series resistance. However, ultra abrupt extension profiles typically are required in advanced devices to reduce and control a short channel effect.

Figure 1B:
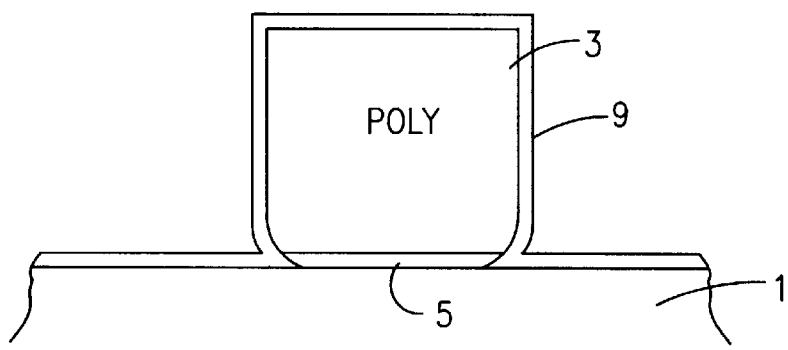

After formation of the gate, an oxide layer may be formed on the gate and the substrate. The oxide layer may have a thickness of about 3 nanometers to about 10 nanometers. FIG. 1b illustrates a structure illustrated in FIG. 1a after formation of oxide layer 9. Any typically used process may be employed to form the oxide layer. Typically, the oxide layer is grown in an oxidizing atmosphere such as an atmosphere including $O_2$ or $N_2O$.

Subsequent to growing an oxide layer over the gate and substrate, source/drain extensions may be implanted into the substrate. The type of the implant depends upon the type of device being created. Along these lines, if an NFET is being created, the extension implant includes N-type dopants. On the other hand, if an PFET is being created, the extension implants include P-type dopants.

Typically, the implant depth is less than about 40 nanometers. Implants at such a depth typically require energies on the order of less than or equal to about 5 KeV for arsenic dopants and less than or equal to about 1 KeV for boron dopants. Of course, the particular dopants utilized, the depth, and energies may vary. Those of ordinary skill in the art would be able to determine appropriate dopants, energies, depths, and other parameters without undue experimentation were the present disclosure.

Figure 1C:
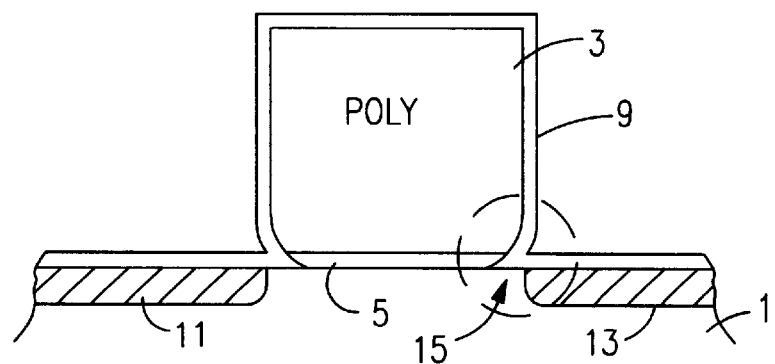
Figure 1D:
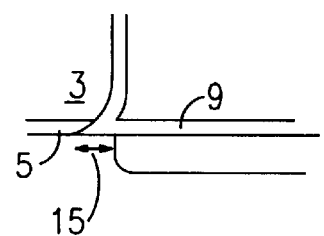

FIG. 1c illustrates the structure after implanting of the source/drain extensions 11 and 13. As can be seen in FIG. 1c, typical CMOS processing may result in an undercutting 15 of the gate. FIG. 1d shows this lack of overlap in greater detail.

To achieve maximum abruptness of the extensions, a subsequent heat cycle is minimized to limit diffusion of the dopants. Due to the fact that the heat cycle is diminished in combination with the undercut of the gate as described above, the shallow, abrupt extensions may not be overlapped well by the polysilicon gate. The problems associated with a lack of overlap are described above.

Typically, to create sufficient overlap of the gates and the source/drain extensions, the extension dopants are diffused sufficiently far such that the junction is placed under the gate. However, this can degrade the short channel effect because the profile of the extension becomes less abrupt; the profile is smeared out by the additional diffusion. This less abrupt, or smeared out, junction has been shown to degrade the short channel effect.

Figure 1E:
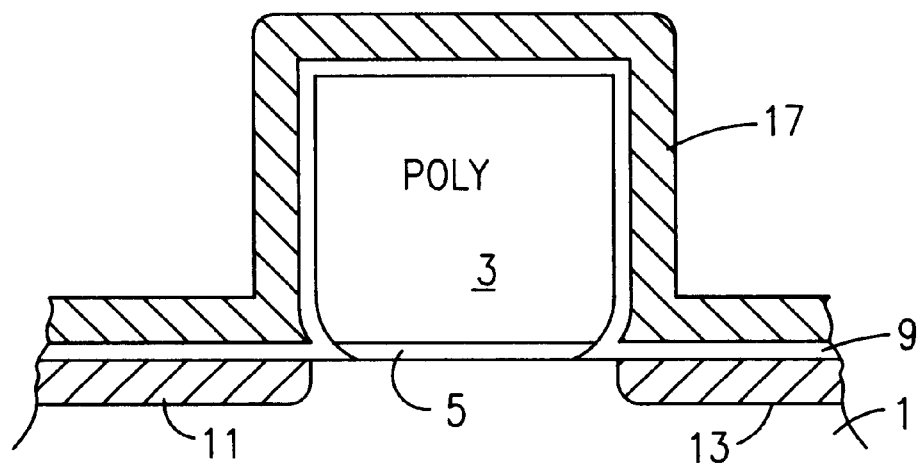

The present invention overcomes these difficulties by providing first, sidewall spacer regions to help ensure necessary gate overlap while maintaining very abrupt junction boundaries. At this point in the process according to the present invention, a layer of silicon may be deposited over the entire structure. FIG. 1e illustrates the device structure illustrated in FIG. 1c after deposition of a silicon layer 17.

Typically, the silicon is amorphous silicon. However, other silicon forms may be deposited. The thickness of the silicon layer may vary depending upon the thickness of the sidewall desired. Typically, the silicon layer has a thickness of about 10 to about 15 nanometers.

Any number of processes may be utilized to deposit the silicon layer. One process that may be utilized is low pressure chemical vapor deposition (LPCVD). Such processes may be carried out at a temperature of less than about 550° C. Of course, any typically utilized process may be utilized to deposit the silicon layer.

Figure 1F:
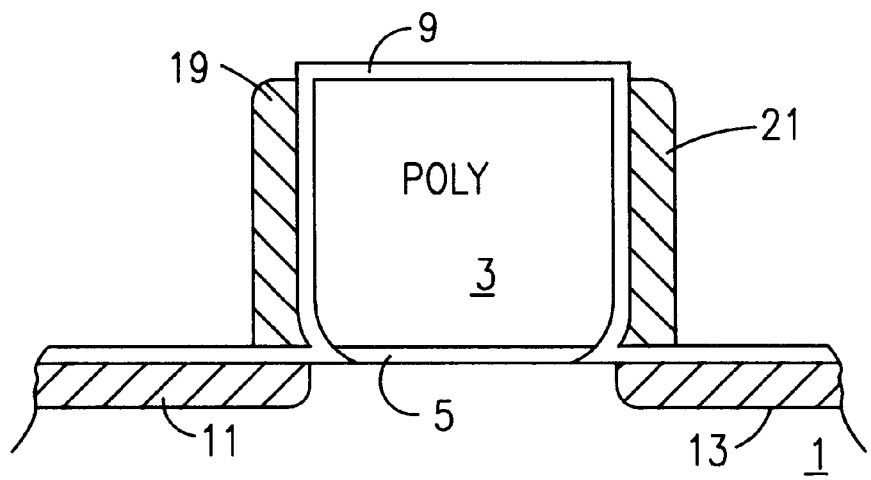

After depositing the silicon layer, portions of the silicon layer not on the sidewalls of the gate may be removed. Any suitable process may be utilized for etching the silicon layer. According to one embodiment, the silicon is etched utilizing an anisotropic etch chemistry. Typically, whatever process is utilized to etch the silicon layer 17, it is very selective to oxide, such that after etching of the silicon layer to form the sidewall spacers, a layer of oxide remains on top of the gate structure as well as on top of the substrate as illustrated in FIG. 1f.

The remaining portions of the silicon layer form the sidewall spacers on the side of the gate structure. FIG. 1f illustrates the structure after etching of the silicon layer to form sidewall spacers 19 and 21. The sidewall spacers 19 and 21 may represent only a first set of spacers that may be part of the present invention. Along these lines, the present invention may include additional spacers as described below.

After formation of the sidewall spacers, additional, or second, spacer regions may be provided on the first, sidewall spacer regions. The second spacer regions may be formed of a variety of materials. Typically, they include at least one dielectric material. Alternatively, a combination of dielectric materials may be utilized. According to one example, the second spacer regions are formed of silicon nitride. Typically, whatever dielectric or dielectrics are utilized, the second spacer region material is resistant to etching in HF.

Typically, the second spacer regions are formed prior to deep source/drain formation. According to one embodiment, the second spacer regions may be formed by depositing a layer of a dielectric material over the entire structure illustrated in FIG. 1f. While any process may be utilized to deposit the second spacer material, one example of such a process is chemical vapor deposition (CVD). The CVD may be carried out at temperatures below about 600° C.

Figure 1G:
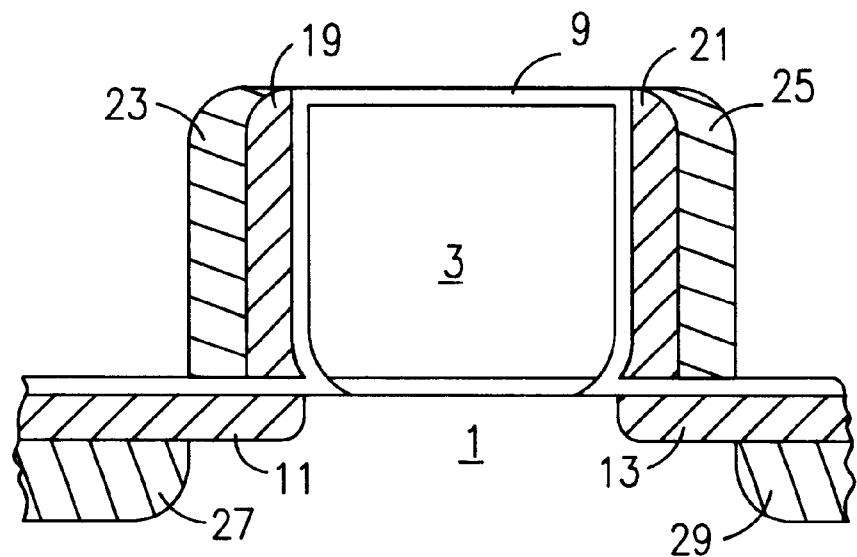

Just as with the formation of the first, sidewall spacer regions, the second spacer regions may be defined from the layer of dielectric material by etching the dielectric material leaving remaining second sidewall regions. FIG. 1g illustrates one embodiment of side wall spacer regions 23 and 25. Any process may be utilized to remove portions of the dielectric layer to define the second spacer regions. According to one example, a reactive ion etch is utilized to define the second spacer regions. As with the etch utilized to define the sidewall spacer regions, typically, whatever process is utilized to define a second spacer regions, it is selective to oxide, such that the oxide layer 9 will remain on top of the gate structure and surface of the substrate 1.

After formation of the second spacer regions, deep source/drain regions 27 and 29 may be implanted into the substrate. The dopants may then be activated. Activation of the dopants can be carried out utilizing a single rapid thermal processing step. However, other processes may be utilized. In spite of this, utilizing a single rapid thermal processing step requiring just a short time may minimize diffusion.

As the deep source/drain implant dopants are implanted into the substrate, they may also dope the polysilicon gate, the sidewall spacers and the second spacer regions. According to one illustrative example, the source/drain dopants, which are N-type dopants for NFET uses and P-type dopants for PFET uses, may be implanted utilizing about 10 KeV to about 15 KeV. The dopants may be activated with a rapid thermal anneal (RTA) at about 1000° C. to about 1100° C. for about 5 to about 15 seconds.

After implanting the deep source/drain implants, the front end of the line (FEOL) process may be completed by forming a top structure over the source/drain and the polysilicon gate. Typically, the top structure is self aligned. Also, typically, the top structure is formed by siliciding the top of the gate structure and the top of the source/drain regions. Such a process for forming the top structure is easily compatible with CMOS processing.

Formation of the top structure typically is preceded by a process for removing exposed regions of the oxide layer 9 on the gate structure and substrate surface. Any suitable process may be utilized. According to one embodiment, a wet etch is performed in HF acid to remove the oxide. The wet etch may be performed prior to cobalt or titanium deposition. The cobalt or titanium deposition may be utilized to form silicide by depositing the cobalt or titanium and reacting them with silicon at elevated temperatures using a RTA process. Typically, the cobalt or titanium is about 50 nm to about 100 nm thick and they are reacted with silicon utilizing a RTA at temperatures of about 500° C. to about 800° C. Removal of the oxide may also permit the sidewall spacer regions to be shorted to the polysilicon gate by the silicide subsequently created.

Shorting of the sidewall spacer to the gate typically is important to help ensure that the gate and the sidewall spacers are at the same potential. The shorting may also help to control the extensions, thereby helping to create sufficient electrical coupling of the device structures.

Figure 1H:
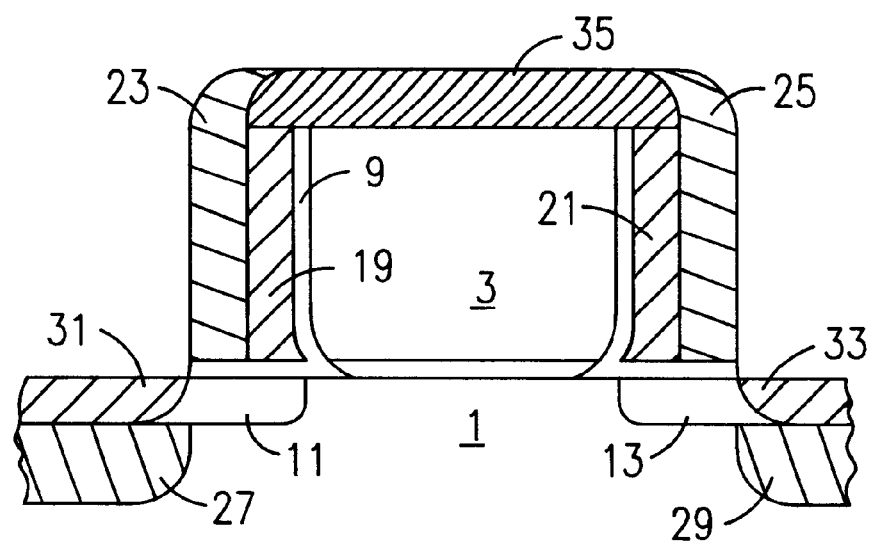

FIG. 1h illustrates an embodiment of a structure according to the present invention after forming the silicided top structures 31 and 33 over the source/drain regions 27 and 29, respectively, and silicided region 35 over the gate 3 and silicon sidewall spacers 19 and 21.

The present invention also includes semiconductor device structure such as that described above and illustrated in the figures.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A semiconductor device structure, comprising:

a semiconductor substrate;

a gate oxide region on a portion of the semiconductor substrate;

a gate structure on the gate oxide region, a portion of the gate structure in the vicinity of a top of the gate oxide region being silicided;

first, sidewall spacer regions on sides of the gate structure, a portion of the sidewall spacer regions in the vicinity of a top of the sidewall spacer regions being silicided;

second spacer regions on sides of the sidewall spacer regions;

an oxide layer between the semiconductor substrate and the sidewall spacer regions and the second spacer regions;

source/drain extension regions in the substrate underlying the sidewall spacer regions and the second spacer regions;

silicided source/drain extension regions in the substrate adjacent the source/drain extension regions in the substrate underlying the side spacer regions and the spacer regions;

source/drain regions underlying the source/drain extension regions and the silicided source/drain extension regions.

2. The semiconductor device structure according to claim 1, wherein the sidewall spacer regions have a thickness of about 10 nm to about 20 nm.

3. The semiconductor device structure according to claim 1, wherein the gate structure and the sidewall spacer regions comprise polycrystalline silicon.

4. The semiconductor device structure according to claim 1, wherein the second spacer regions comprise dielectric material.

5. The semiconductor device structure according to claim 1, wherein the second spacer regions comprise silicon nitride.

6. The semiconductor device structure according to claim 1, wherein the sidewall spacer regions are shorted to the gate structure.

* * * * *